(12) United States Patent  
Glechner et al.

(10) Patent No.: US 12,410,511 B2  
(45) Date of Patent: Sep. 9, 2025

(54) COATED ARTICLE WITH ENHANCED OXIDATION RESISTANCE PROPERTIES

(71) Applicant: OERLIKON SURFACE SOLUTIONS AG, PFÄFFIKON, Pfäffikon (CH)

(72) Inventors: Thomas Glechner, Vienna (AT); Jürgen Ramm, Maienfeld (CH); Hans-Georg Oemer, Kronstorf (AT); Helmut Riedl-Tragenreif, Kirchberg am Walde (AT); Oliver Hunold, Wädenswil (CH); Mirjam Arndt, Wetzlar (DE); Peter Polcik, Reutte (AT)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 0 days.

(21) Appl. No.: 18/694,633

(22) PCT Filed: Sep. 22, 2022

(86) PCT No.: PCT/EP2022/076328  
§ 371 (c)(1),  
(2) Date: Mar. 22, 2024

(87) PCT Pub. No.: WO2023/046820  
PCT Pub. Date: Mar. 30, 2023

(65) Prior Publication Data  
US 2024/0392429 A1 Nov. 28, 2024

(30) Foreign Application Priority Data  
Sep. 23, 2021 (DE) .................. 10 2021 004 792.3

(51) Int. Cl.  
*C23C 14/35* (2006.01)  
*C23C 14/06* (2006.01)  
(Continued)

(52) U.S. Cl.  
CPC ............ *C23C 14/35* (2013.01); *C23C 14/067* (2013.01); *C23C 14/10* (2013.01); *C23C 14/3414* (2013.01); *C23C 14/5806* (2013.01)

(58) Field of Classification Search  
None  
See application file for complete search history.

(56) References Cited

U.S. PATENT DOCUMENTS

| | | | | |
|---|---|---|---|---|
| 2014/0076467 A1* | 3/2014 | Na | .............. | C22F 1/10 420/443 |
| 2014/0234582 A1* | 8/2014 | Honda | .............. | C23C 28/42 428/141 |
| 2015/0092480 A1* | 4/2015 | Choi | .............. | H10N 70/231 365/158 |

FOREIGN PATENT DOCUMENTS

CN 112 323 031 A 2/2021  
JP 2008030159 A * 2/2008

OTHER PUBLICATIONS

International Search Report with Written Opinion for PCT/EP2022/076328 filed Sep. 22, 2022.

(Continued)

*Primary Examiner* — Seth Dumbris  
(74) *Attorney, Agent, or Firm* — Fleit Intellectual Property Law; Paul D. Bianco

(57) ABSTRACT

A coated article includes a coated surface which consists of a substrate and a coating system. The coating system has at least one protective layer consisting of one or more transition metal borides and one dopant element, wherein: 13 the protective layer having chemical element composition defined by the formula $TM_xB_ySi_q$, where TM is one or more of the transition metal elements Chromium and Hafnium; Si is Silicon present in the protective layer as the dopant element; B is Boron; x is the concentration in atomic percent of TM; y is the concentration in atomic percent of B; and q is the concentration in atomic percent of Si, where $x+y+q=1$, $0.15 \leq x \leq 0.33$, $0.40 \leq y \leq 0.67$, and $0.1 \leq q \leq 0.40$, and—the atomic concentration ratio of boron to the transition metals in the protective layer is higher or equal to 2, i.e. $y/x \geq 2$, and—the protective layer exhibits an $AlB_2$ crystal structure.

22 Claims, 7 Drawing Sheets

Figure 1:
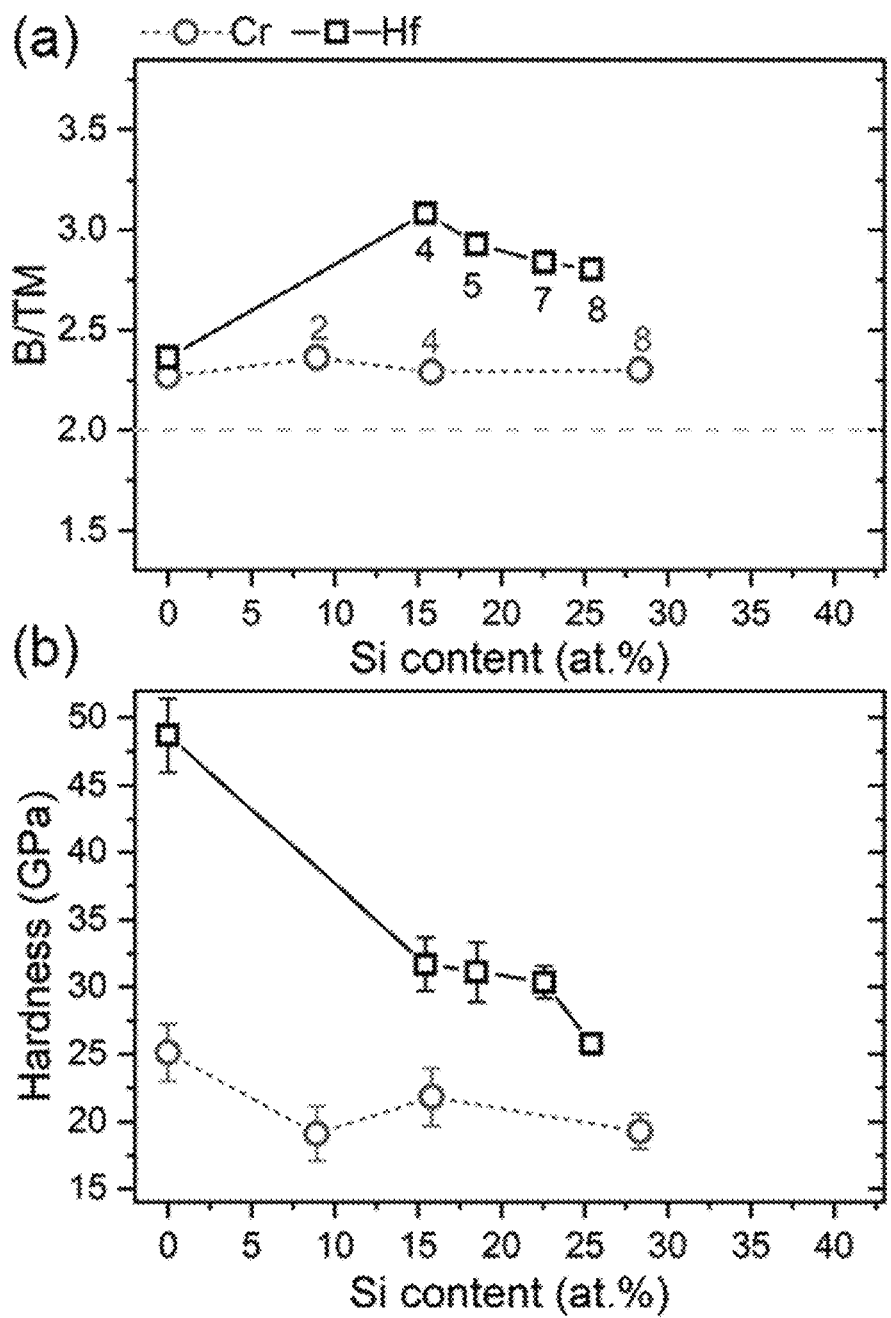

(51) Int. Cl.
    *C23C 14/10*     (2006.01)
    *C23C 14/34*     (2006.01)
    *C23C 14/58*     (2006.01)

(56) References Cited

OTHER PUBLICATIONS

Ding Ji Cheng et al: "Influence of Si addition on structure and properties of $TiB_2$—Si nanocomposite coatings deposited by high-power impulse magnetron sputtering", Ceramics Intl, vol. 45, No. 5, Dec. 18, 2018, pp. 6363-6372.

Grancic B et al: "Effect of Si addition on mechanical properties and high temperature oxidation resistance of Ti—B—Si hard", Surface and Coatings Technology, vol. 240, Dec. 21, 2013, pp. 48-54.

Mollica, "RBS and XRD analysis of silicon doped titanium diboride films", The 11th Australian Conference on Nuclear Techniques of Analysis and the 5th Vacuum Society of Australia Congress, Jan. 1999; p. 247-250.

Kiryukhantsev-Korneev F. V. et al: "Study of ZrSiB Coatings Obtained by Magnetron Sputtering of $ZrB_2$—20%Si and $ZrB_2$—50%$ZrSi_2$ Cathodes", Physics of Atomic Nuclei, vol. 82, No. 11, Mar. 19, 2020, pp. 1437-1440.

Glechner T. et al: "Influence of Si on the oxidation behavior of Tm—Si—$B_2$ z coatings (Tm=Ti, Cr, Hf, Ta, W)", Surface and Coatings Technology, vol. 434, Feb. 3, 2022, 11 pages.

International Preliminary Report on Patentability for PCT/EP2022/076328 filed Sep. 22, 2022.

V. Moraes et al, Ab initio inspired design of ternary boride thin films, Sci. Rep. (2018) 8:9288, 9 pages.

\* cited by examiner

COATED ARTICLE WITH ENHANCED OXIDATION RESISTANCE PROPERTIES

The present invention relates to a coated article and a method for producing the inventive coated article. The inventive coated article exhibiting enhanced oxidation resistance properties, comprising a substrate and a coating system, the coating system comprising a transition metal boride coating layer with capability to form an oxidation barrier coating layer, or the coating system comprising a transition metal boride layer with capability to form an oxidation barrier coating layer and an oxidation barrier coating layer. The transition metal boride coating layer with capability to form an oxidation barrier coating layer consisting of one or more borides of one or more transition metals, wherein the transition metals are chromium and/or hafnium, and this layer comprising silicon as dopant.

FIELD OF INVENTION

Transition metal (TM) borides are known for their refractory character involving melting temperatures above 3000° C., a wide phase stability, or a high thermal conductivity as well as strong thermo-shock resistance. Increasing interest in a sustainable usage of materials as well as the longevity of high-performance components—e.g. machine elements in aero engines—suggest TM boride based materials as a new class of protective thin films. Especially, the stability of such coatings at high temperature is therefore desirable and strategies are developed to improve the poor oxidation resistance of such coatings.

STATE OF THE ART

When oxidizing diboride based bulk ceramics typically an oxide scale with a glassy top $B_2O_3$ (boria) layer is formed, as it is known from $TiB_2$, $ZrB_2$, and $HfB_2$. In detail, three different regimes can be distinguished: (i) a low temperature regime typically below 900 to 1000° C. obtaining a crystalline metal oxide layer with a more or less dense boria layer on top, (ii) a second regime up to 1600 to 1800° C. with an initial evaporation of the top $B_2O_3$, and (iii) the last regime above 1800° C. being dominated by the volatile evaporation of boria next to porous metal oxides. However, also environmental conditions such as atmospheric humidity or flow conditions can influence the oxide scale formation of TM borides. The presence of water vapor is known to expedite the formation of volatile boric acid ($HBO_2$) promoting the volatility of boria, and hence decreasing the oxidation resistance.

Until now it is known that to sustain long term oxidation at elevated temperatures (>1000° C.), only alumina and silica based oxide scales provide sufficiently low parabolic rate constants—in a magnitude of about $10^{-10}$ $kg^2m-4s-1$ at 1100° C.

Problem to be Solved

The main objective of the present invention is to provide coated articles having coated surfaces exhibiting the very advantageous properties of transition metal borides but at the same time a higher oxidation resistance at high temperatures, in particular at temperatures in a range between 800° C. and 1500° C.

DESCRIPTION OF THE PRESENT INVENTION

The above-mentioned problem is solved by providing a coated article and a method for producing the inventive coated article, the coated article in particular as described in the claims 1 to 10 and the method in particular as described in the claims 11 to 16.

The inventive coated article comprises a coated surface, the coated surface consisting of a substrate and a coating system, the coating system comprising at least one protective layer consisting of one or more transition metal borides and one dopant element, wherein:

the protective layer has a chemical element composition defined by the formula $TM_xB_ySi_q$, where:

TM is one or more transition metal elements selected from the group formed by Chromium, Cr, and Hafnium, Hf, Si is Silicon and is present in the protective layer as the dopant element, Bis Boron, x is the concentration in atomic percent of TM in the protective layer, y is the concentration in atomic percent of B in the protective layer, q is the concentration in atomic percent of Si in the protective layer, $x+y+q=1$, $0.15{\leq}x{\leq}0.33$, $0.40{\leq}y{\leq}0.67$, and $0.1{\leq}q{\leq}0.40$, the atomic concentration ratio of boron to the transition metals in the protective layer is higher or equal to 2, i.e. $y/x{\geq}2$, and the protective layer exhibits an $AlB_2$ crystal structure.

It is important to note, that it is possible that unintentionally oxygen or oxygen and carbon and/or also other elements (e.g. argon) are present in protective layer as trace elements.

According to a preferred embodiment of a coated article according to the present invention, the content of Si denoted by q is higher than 0.1, which enables attaining a surprisingly considerable further increase of the oxidation resistance, by promoting the formation of a dense Si-enriched scale. More preferably q is higher than 0.2. Still more preferably q is higher than 0.3.

According to a further preferred embodiment of a coated article according to the present invention, the protective layer is placed as outermost layer of the coating system or as close as possible to the outermost layer (e.g. direct next to the outermost layer) in order to favor the formation of a dense Si-enriched scale.

According to a further preferred embodiment of a coated article according to the present invention, the coating system comprises an oxide layer formed as outermost layer of the coating system, the oxide layer comprising silicon and oxygen, or consisting of silicon and oxygen, preferably comprising silicon dioxide, $SiO_2$.

The oxide layer in the context of the present invention is in one preferred embodiment an oxide layer comprising or consisting of an Si-enriched scale (in the context of the present description also called a dense Si-enriched scale) promoted by the Si comprised in the protective layer, which diffuses in direction to the outermost surface of the coating system and reacts with oxygen available at the outermost surface of the coating system thereby forming the Si-enriched scale.

When the inventive coated article comprises an oxide layer as described in one of the preferred embodiments described above, the protective layer is preferably placed directly under the oxide layer.

The thickness of the oxide layer is preferably in a range from 50 nm to 5000 nm.

The protective layer preferably exhibits a separate crystalline Si phase, which is visible in the XRD spectrum of the protective layer at 2 theta angles of 28.44° and/or 47.3°. This separate crystalline Si phase can be produced for example by subjecting the protective layer to a process that causes oxidation of the protective layer, e.g. an annealing step or any step resulting in oxidation, in such a manner that the separate crystalline Si phase is formed in the protective layer and can be detected after oxidation. The inventors think that the formation of this separate crystalline Si Phase promotes the formation of an Si-enriched scale as described above. The Si-enriched scale in the context of the present invention should in particular be understood as an Si—O-containing oxide layer.

Preferably the oxidation kinetic of the protective layer is in the range from $10^{-9}$ $kg^2m^{-4}s^{-1}$ up to $10^{-13}$ $kg^2m^{-4}s^{-1}$ for a temperature of 1100° C.

Preferred substrates in the context of the present invention comprise or consist of one or more materials selected from the group formed by Steel, cemented carbides, Inconel, Hastelloy, Waspaloy, superalloys, Ti-containing materials, oxides, oxid-oxid ceramics, SiC-containing materials, Carbon-based materials, Yttria-stabilized zirconia.

A method for producing an inventive coated article according to any of the above-mentioned embodiments preferably involves one or more steps in which the protective layer is formed by using a coating process.

According to a preferred embodiment of a method for producing coated articles according to the present invention, the method comprises at least following steps:
the at least one protective layer is formed by using a coating process, and
the oxide layer and/or the separate crystalline Si phase in the protective layer is/are produced by a heat treatment conducted after the coating process, wherein the $AlB_2$ crystal structure is already produced during the coating process, and maintained during and after the heat treatment, and wherein the heat treatment comprises an annealing process carried out at a process temperature in a range between 800° C. and 1500° C., preferably in a range between 1100° C. and 1300° C.

Preferably a coating process used in any of the methods for forming the protective layer for producing coated articles according to the present invention is carried out by using:
physical vapor deposition (PVD) techniques, and/or
chemical vapor deposition (CVD) techniques, and/or
thermal or plasma assisted chemical vapor deposition (TA-CVD or PA-CVD).

According to a preferred embodiment the coating process for producing the protective layer is carried out in such a manner that one or more targets comprising silicon are used as coating source material for providing the desired silicon concentration in the oxidation barrier coating layer during coating process, which is carried out by using physical vapor deposition (PVD) techniques, preferably of the type arc PVD techniques or sputtering PVD techniques, e.g. magnetron sputtering or high power impulse magnetron sputtering (HiPIMS).

According to another preferred embodiment the coating process for producing the protective layer is carried out in such a manner that one or more gas flows comprising silicon are used as coating source material for providing the desired silicon concentration in the oxidation barrier coating layer during coating process, which is carried out by using physical vapor deposition (PVD) techniques, preferably of the type arc PVD techniques or sputtering PVD techniques, e.g. magnetron sputtering or high power impulse magnetron sputtering (HiPIMS).

DESCRIPTION OF SOME CONCRETE EXAMPLES OF THE PRESENT INVENTION

In order to explain the invention in more detail, some Examples of coating systems and methods for producing the coating systems for producing coated articles according to the present invention will be described below with the help of the FIGS. 1 to 7. The content of these Examples and Figures should not be understood as any limitation of the present invention but as embodiments or showcases of the present invention.

LIST OF FIGURES

FIG. 1: (a) Chemical composition of all as deposited coatings determined by ICP-OES. The dashed line represents the B/TM ratio of a stoichiometric $TMB_2$ coating material. Numbers denote the quantity of Si platelets used to obtain the composition. (b) Hardness determined using nanoindentation for all coatings in the as deposited state.

Figure 2:
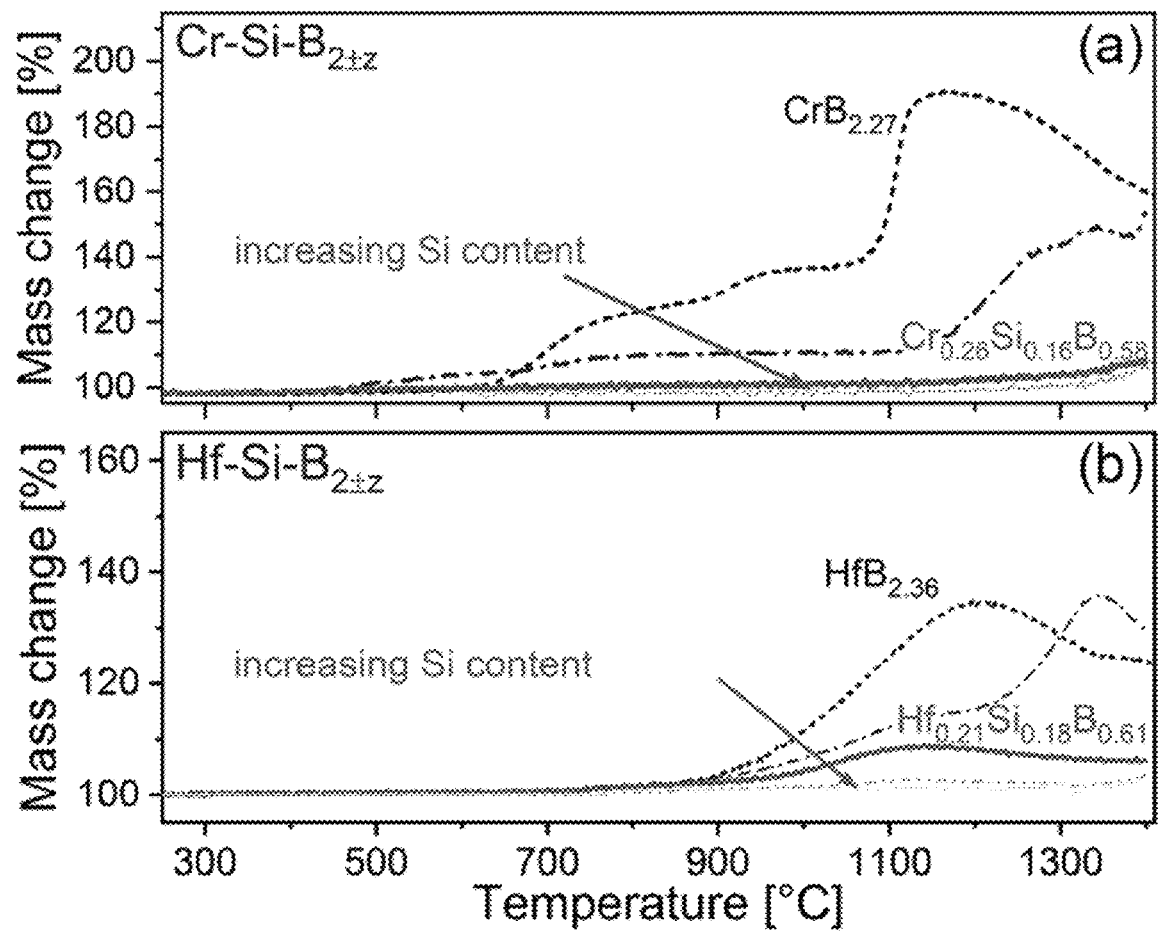

FIG. 2: Mass change during dynamic oxidation performed in a TG system using synthetic air and a heating rate of 10 K/min. Dashed lines represent the binary coatings, $CrB_{2.27}$ (a) and $HfB_{2.36}$ (b). Dashed-dot and dotted lines represent TM-Si—$B_{2\pm z}$ coatings with various Si contents. Solid lines represent the TM-Si—$B_{2\pm z}$ coatings which were investigated in more detail, $Cr_{0.26}Si_{0.16}B_{0.58}$ (a) and $Hf_{0.21}Si_{0.18}B_{0.61}$ (b).

Figure 3:
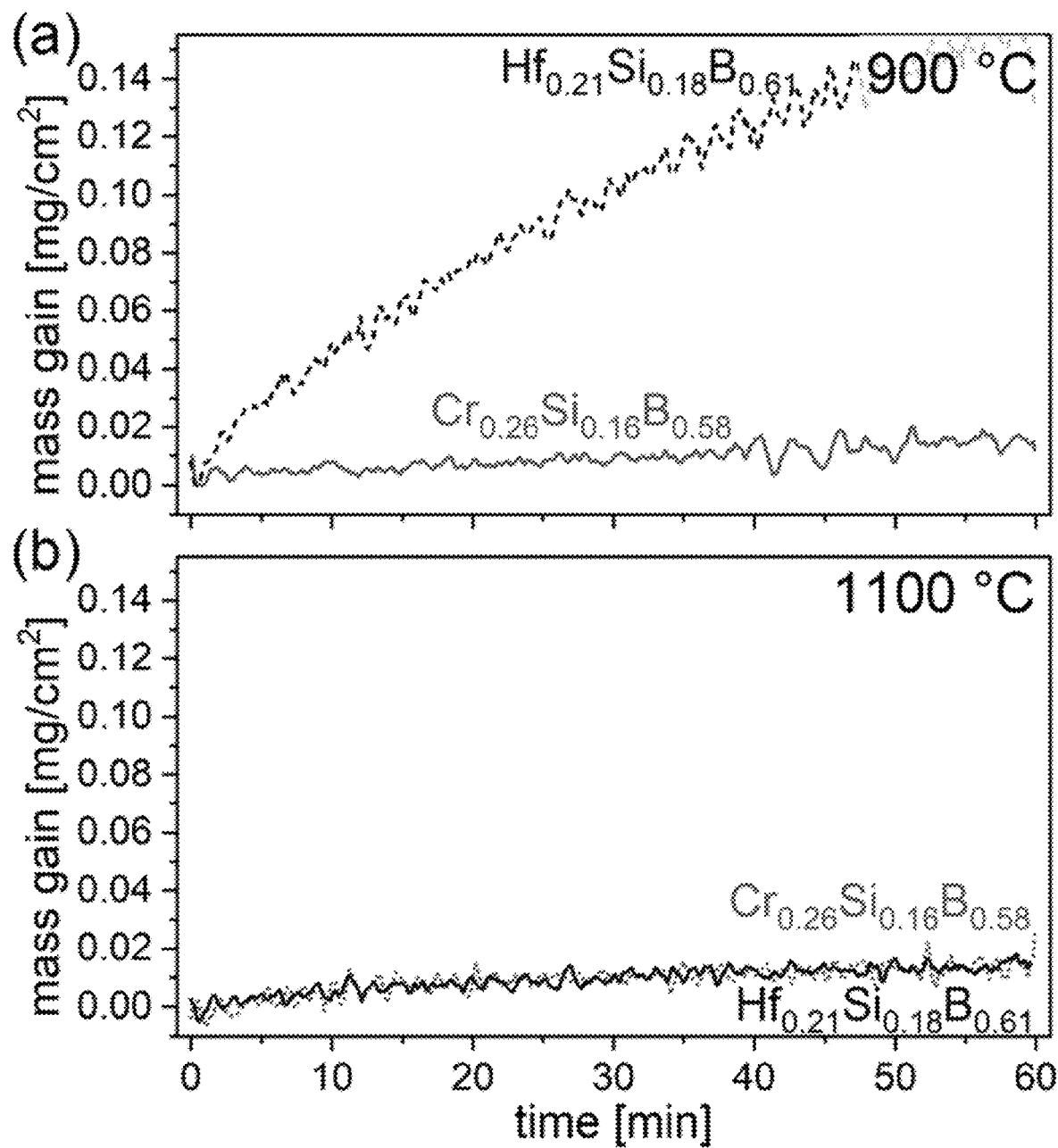

FIG. 3: Mass gain during isothermal oxidation at 900° C. (a), and 1100° C. (b).

Figure 4:
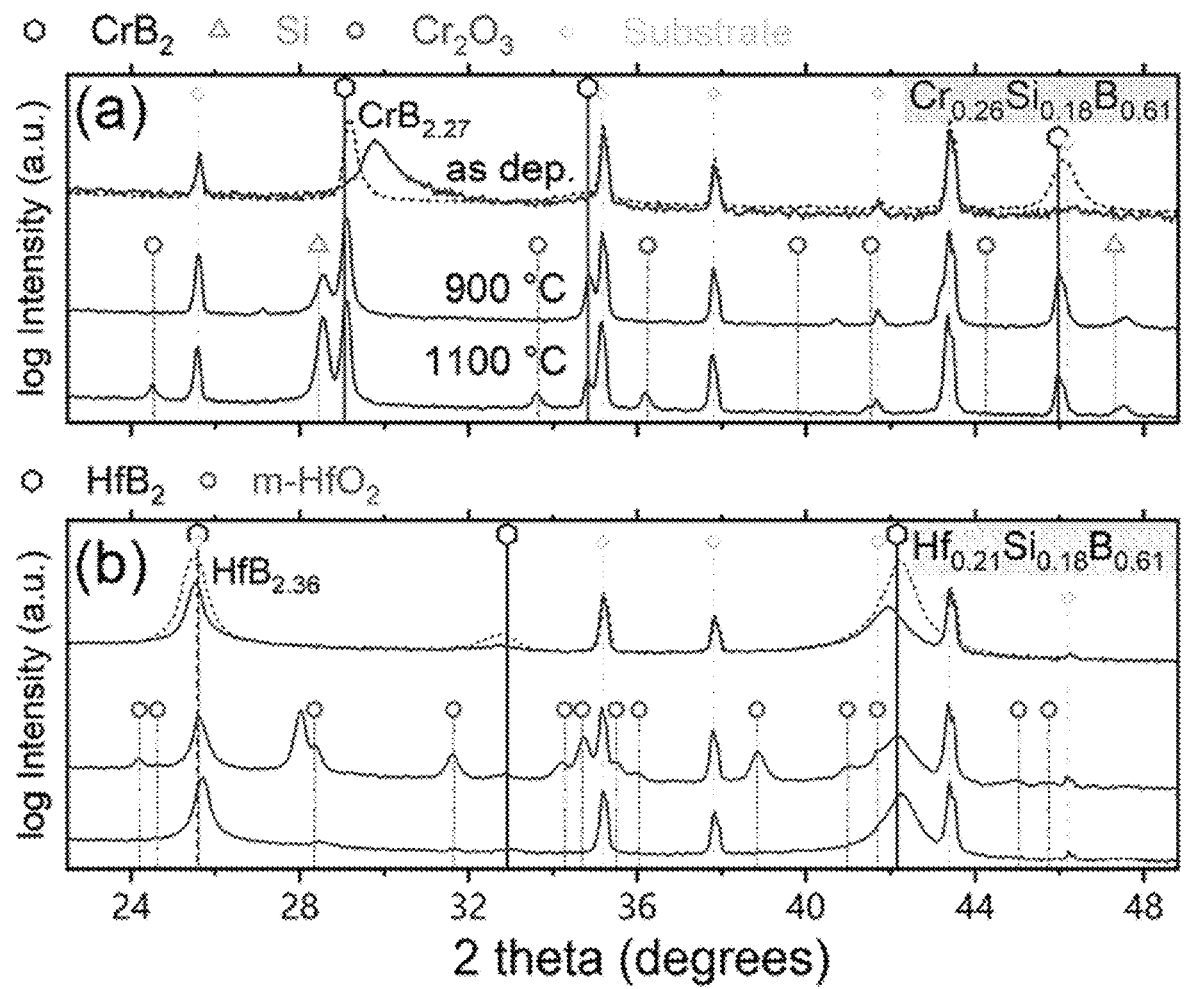

FIG. 4: XRD analysis of $Cr_{0.26}Si_{0.16}B_{0.58}$ (a) and $Hf_{0.21}Si_{0.18}B_{0.61}$ (b). The upper spectrum represents the as deposited state the middle after isothermal oxidation at 900° C. and the bottom one after oxidation at 1100° C. for each system. In addition to that the dashed line in the as deposited state represents the spectra of the binary coating. The solid reference lines with the hexagons on top represent the $AlB_2$ prototype structure for each diboride FIG. 5: SEM fracture cross sections of $Cr_{0.26}Si_{0.16}B_{0.58}$ (a) and $Hf_{0.21}Si_{0.18}B_{0.61}$ (b) after isothermal oxidation at 900° C. (left side) and 1100° C. (right side). White dashed lines represent the different interfaces.

Figure 6:
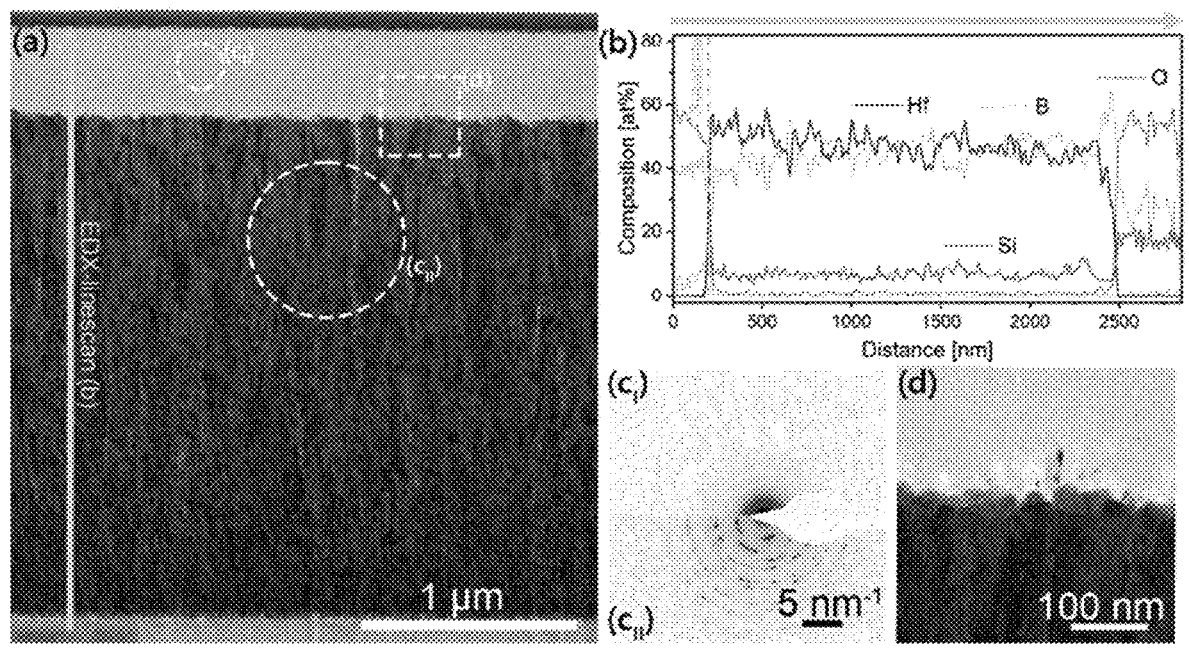

FIG. 6: TEM investigation of $Hf_{0.21}Si_{0.18}B_{0.61}$ oxidized in ambient air at 1200° C. for 3 hours. (a) BF image covering the whole coating and the formed oxide scale on top. (b) EDX line scan over the whole thickness as indicated by the arrow in (a). (c) SAED image of the oxide scale and (d) magnified interface between the remaining coating and the oxide scale.

Figure 7:
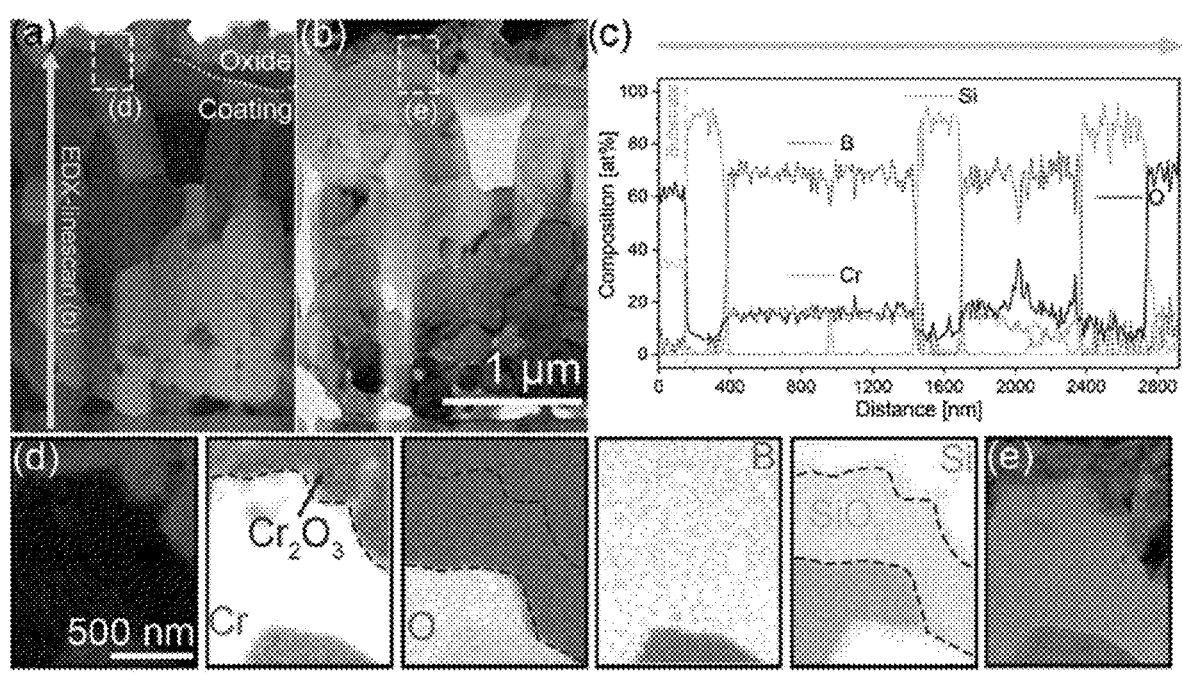

FIG. 7: $Cr_{0.26}Si_{0.16}B_{0.58}$ oxidized in ambient air at 1200° C. for 3 hours. High angle annular dark field (HAADF) image (a) and BF image (b) of the whole remaining coating including the substrate on bottom and oxide scale on top. (c) EDX linescan over the whole coating thickness as indicated by the arrow in (a). STEM image and elemental EDX maps (d) of the area indicated by dashed lines in (a) and (b) and corresponding BF image (e).

Within the context of the present invention, Cr—B— and Hf—B-based coatings were investigated with respect to thermal stability in oxidative environments.

During the investigation of the $HfB_2$ coatings, a similar oxidation behavior for the investigated $HfB_2$ coatings in comparison with its bulk ceramic counterpart forming also a layered scale was observed, exhibiting a dense scale at 900° C., pursuing a parabolic rate law with the rate constant kp of $1.39 \cdot 10^{-9}$ $kg^2m^{-4}s^{-1}$.

The TM-Si—$B_{2\pm z}$ (TM: Cr and/or Hf) based thin films were deposited by PVD magnetron sputtering utilizing $CrB_2$ and $HfB_2$ targets (Plansee Composite Materials GmbH). Silicon was added to deposition by adding single crystalline Si platelets onto the sputter racetrack of the targets. By varying the number of pieces, the Si content was adjusted within the TM-Si—$B_{2\pm z}$ coatings. The targets were operated in DC mode with a current of 0.5 A (0.4 A for $CrB_2$) in pure argon atmosphere at a working pressure of 0.56 Pa. The thin films were deposited on polycrystalline $Al_2O_3$ (20×7×0.38 $mm^3$) and sapphire (10×10×0.53 $mm^3$) substrates at a target to substrate distance of 90 mm. A substrate temperature of 550° C. as well as a bias potential of −40 V was used for all depositions.

For stoichiometry determination, samples were analyzed by liquid Inductively Coupled Plasma Optical Emission Spectroscopy (ICP-OES) after acid digestion. To exclude silicon contamination from the substrates, only samples on $Al_2O_3$ wafers were investigated. All chemicals were of the highest purity available, ultrapure water with a resistivity of 18.2 MΩ was obtained by a Barnstead EASYPURE II water system (Thermo Fisher Scientific, USA), single element ICP standards and concentrated acids were purchased from Merck (Germany). Samples were broken into 5×5 mm pieces and digested in triplicates with a mixture of 0.5 mL $HNO_3$ and 0.5 mL HF in falcon tubes, by heating to 80° C. for 10 minutes. The samples were afterwards diluted to a volume of 20 mL with $H_2O$ and europium was as internal added, to yield a final concentration of 1 µg/g europium. Samples were measured with an ICAP 6500 RAD (Thermo Fisher, USA), with an ASX-520 autosampler (CETAC Technologies, USA) using a HF resistant sample introduction kit, consisting of a Miramist nebulizer (Burger Research, USA), an alumina injector tube and a PTFE spray chamber. Background corrected emission signals were quantified using matrix adjusted external calibration standards.

The mechanical properties were assessed by Nanoindentation using an Ultra Micro Indentation System (UMIS) equipped with a Berkovich diamond tip (all measurements done on sapphire substrates). For every sample, 30 idents with different applied loads (3 to 45 mN) were performed and their load-displacement curves were analyzed after Oliver and Pharr. Poisson ratios for calculating the Young's modulus were taken from the reference document: V. Moraes. H. Riedl, C. Fuger, P. Polcik, H. Bolvardi, D. Holec, P. H. Mayrhofer, Ab initio inspired design of ternary boride thin films, Sci. Rep. 8 (2018) 9288.

To study the oxidation behavior of the deposited coatings, a Thermo-Gravimetric Analysis (TGA) system was used which was equipped with a Rhodium oven (Netzsch STA 449 F1). The TGA system has a resolution of 0.1 µg, obtaining a limit of about 10 µg to detected significant effects. The polycrystalline $Al_2O_3$ substrates were weighed before and after the deposition to determine the weight of the coatings and subsequently put into a customized crucible. Dynamic oxidation treatments (steady temperature rise between RT and 1400° C.) were carried out under a flowing stream of synthetic air (50 ml/min) and helium (20 ml/min), which is necessary to protect the scales (heating rate of 10 K/min). For isothermal oxidation, synthetic air was only flowing through the furnace during the isothermal step. A baseline measurement with empty crucibles was carried out for each run. In addition, oxidation treatments in ambient air at 1200° C. have been carried out in a standardized chamber box furnace, placing the coated substrates on fireclay tile.

X-ray diffraction (XRD) analysis was done in Bragg Brentano configuration, using a Panalytical Empyrean diffractometer equipped with a Cu—$K_\alpha$, radiation source (wavelength λ=1.5418 Å). The morphology and oxide scale thickness were studied using a scanning electron microscope (SEM, FEI Quanta 250 FEGSEM operated at 5 keV). Furthermore, for more detailed investigation of the oxidized samples Transmission Electron Microscopy (TEM, FEI TECNAI F20, equipped with a field emission gun and operated at an accelerating voltage of 200 kV) was conducted.

The chemical compositions for the synthesized coatings obtained by ICP-OES are shown in FIG. 1a, indicating the B/TM ratio in function of silicon content (the numbers next to the symbols refer to the number of Si platelets). The stoichiometry indicates metal deficiency of the synthesized $TMB_{2\pm z}$ coatings ($CrB_{2.27}$, and $HfB_{2.36}$). The silicon content increases with an increasing number of Si platelets placed on the racetrack. The B/TM ratio stayed nearly constant for Cr while for Hf-based coatings no clear trend is visible, as the B/TM ratio is highest for the lowest amount of Si platelets.

In FIG. 1b the influence of Si on the mechanical properties (hardness and Young's modulus) of the TM-Si—$B_{2\pm z}$ is summarized. The binary coatings exhibit high hardness values of 25.1±2.1 GPa for $CrB_{2.27}$ and 48.7±2.7 GPa for $HfB_{2.36}$. The Si alloyed films show a decreased hardness. For about 15 at. % Si the hardness is in the range of 22 GPa and 32 GPa for Cr- and Hf-based coatings, respectively. The hardness and Young's modulus of the coatings which will be investigated in more detail below are H=22±2.1 GPa and E=410±31 GPa for $Cr_{0.28}Si_{0.16}B_{0.58}$ and H=32±2.2 GPa and E=468±34 GPa for $Hf_{0.21}Si_{0.18}B_{0.61}$.

In FIG. 2, the mass changes (in percent of the initial mass) in function of temperature during dynamic oxidation are plotted. The dashed lines correspond to the binary TM-$B_{2\pm z}$ coatings, while the solid lines indicate the Si alloyed coatings which are investigated in more detail here. In addition, the dotted and dash-dotted lines represent the TM-Si—$B_{2\pm z}$ coatings with the other Si contents. The mass signals are constant up to a certain temperature (oxidation onset temperature) indicating no oxide scale formation followed by an increase in mass, due to a progressing oxidation. The oxidation onset temperature is 610° C. for $CrB_{2.27}$ and 800° C. for $HfB_{2.36}$. Above this onset temperature the mass increases until the coating is fully oxidized and then subsequently decreases due to volatilization of $B_2O_3$-typically above 1100° C.

To further evaluate and understand these trends in mass gain measured during dynamic oxidation, isothermal oxidation treatments for 1 hour at two temperatures. 900° C. and 1100° C., have been conducted. At 900° C. isothermal oxidation results in a mass increase following a parabolic rate law for $Hf_{0.21}Si_{0.18}B_{0.61}$ (FIG. 3a). As already suggested by the results presented in FIG. 2a, $Cr_{0.26}Si_{0.16}B_{0.58}$ exhibits a mass gain being below the resolution limit of the TG system, hence a strongly retarded growth kinetic. For oxidizing the coating materials at 1100° C., the increase of mass for the TM-Si—$B_{2\pm z}$ coatings is very low (again in the range of the resolution limit of the TG system), hence suggesting a very retarded oxide growth rate. Visual inspection indicates well adherent and dense oxide scales. Due to the resolution limit of the TG system only an upper limit of the parabolic rate constants ($k_p$) of $1 \cdot 10^{-11}$ $kg^2m^{-4}s^{-1}$ could be determined.

To further understand the dependence of the oxide scale formation with respect to the temperature, comparative structural analysis by XRD was performed for the as deposited and oxidized states for isothermal treatments at 900 and 1100° C. (FIG. 4). All binary TM-$B_{2\pm z}$ coatings crystallize in the $AlB_2$ prototype, shown as dashed lines. The $AlB_2$ structure type is defined by a SG 191 structure (P6/mmm, Pearson Symbol hP3), obtaining covalently bonded boron sheets (arrangement of atoms) between metal layers with a ratio of B/TM=2. The TM-Si—$B_{2\pm z}$ coatings are plotted as solid black lines, from top to bottom in the as deposited state as well as oxidized at 900 and 1100° C., respectively. With the addition of Si, the predominant peaks get gradually broadened. For $Cr_{0.26}Si_{0.16}B_{0.58}$, a peak shift to higher 2 theta diffraction angle is visible (FIG. 4a). For $Cr_{0.26}Si_{0.16}B_{0.61}$, the oxidation at 900 and 1100° C. results in a phase separation of elemental Si (Si peaks in FIG. 4a). Furthermore, the $CrB_2$ peaks are shifted back to their reference position also exhibiting a decreased FWHM indicating recrystallisation.

For $Hf_{0.21}Si_{0.18}B_{0.61}$, the structural analysis in the oxidized states does not suggest any decomposition or recrystallisation processes. But strong monoclinic $HfO_2$ peaks are visible at 900° C., whereas at 1100° C. they almost disappear.

Figure 5:
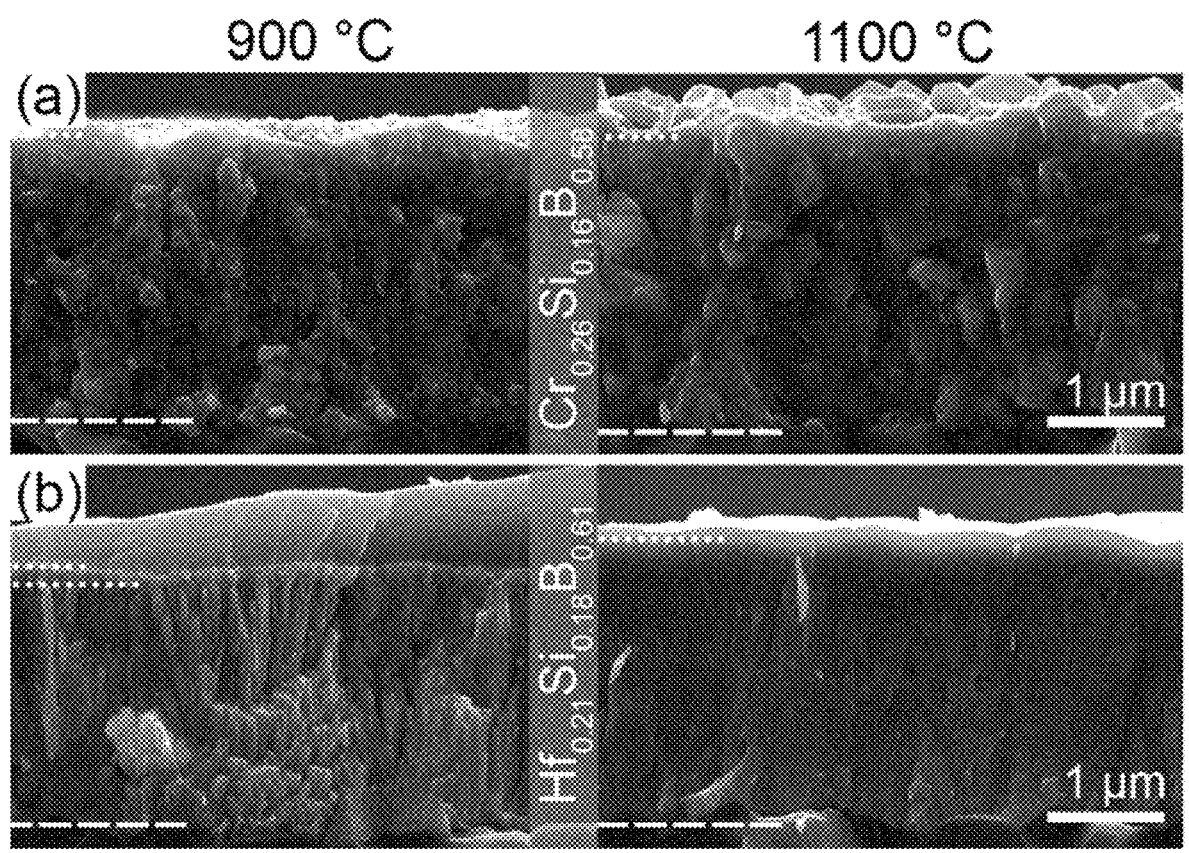

To gain a further insight on the formed oxide scales, SEM cross sections of the $Cr_{0.26}Si_{0.16}B_{0.58}$ (a) and $Hf_{0.21}Si_{0.18}B_{0.61}$ (b), isothermally oxidized coatings are presented in FIG. 5. All left-hand micrographs denote the coatings oxidized at 900° C., whereas the right-hand cross sections are oxidized at 1100° C. (durations see FIG. 3). The dashed lines highlight the interfaces between the substrate and coating, whereby the dotted lines indicate the interfaces between the scale and coating, or between the different types of oxide scales. For all coatings, a remaining unoxidized region can be identified.

Additional isothermal oxidation treatments have been conducted in a conventional furnace in ambient air and for higher temperatures and longer durations. FIG. 6 shows TEM analysis of $Hf_{0.21}Si_{0.18}B_{0.61}$ oxidized on a sapphire substrate at 1200° C. for 3 hours. The bright field image (BF) clearly indicates the remaining coating from bottom to top, followed by a bright but very thin oxide scale on top. The as deposited coating thickness decreased by 100 nm from 2.4 to 2.3 µm after oxidation, whereas the oxide scale itself obtains a thickness of 400 nm. The oxide scale appears amorphous in the selected area electron diffraction (SAED) analysis (FIG. $6c_I$) and a $HfB_2$ (see FIG. $6c_{II}$) with $AlB_2$ structure and decreasing column size from top to bottom can be seen. The EDX line scan shows a very sharp interface towards the sapphire substrate and an equal distribution of Hf, B and Si over the whole remaining coating thickness. Furthermore, the line scan suggests a boron enrichment at the coating oxide interface as well as that the oxide scale is dominated by silicon with some additions of boron. However, the accuracy of EDX to quantify boron is very low, hence the obtained compositions have to be interpreted with care. Si and Hf also overlap within the EDX spectra causing an additional overestimation of Hf on the cost of Si. Additional EELS analysis suggests that the boron content in the oxide scale is significantly lower than evaluated by EDX. The chemical composition of the oxide scale on top of $Hf_{0.21}Si_{0.18}B_{0.61}$ determined with EELS is about $Si_{0.46}B_{0.03}O_{0.51}$.

In contrast, $Cr_{0.26}Si_{0.16}B_{0.58}$ oxidized at 1200° C. for 3 hours has a rather different appearance during TEM analysis (FIG. 7). First of all, the high-angle annular dark-field (HAADF, see FIG. 7a) as well as the bright field image (see FIG. 7b) show, that the remaining coating is completely recrystallized exhibiting large globular grains with some voids in-between. Furthermore, the HAADF image exhibits bright and dark appearing grains representing regions with higher atomic number (bright) and lower atomic number (dark). Along with the EDX line-scan (FIG. 7c) Cr-rich and Si-rich grains can be identified. In addition, further XRD analysis clearly proves $CrB_2$ next to elemental Si peaks similar to the results presented in FIG. 4. Hence, bright areas represent $CrB_2$ whereas darker areas are Si enriched grains. Furthermore, Cr and O overlap within the EDX spectra, causing the overestimation of O in $CrB_2$. Nevertheless, on top of the decomposed microstructure also a very thin and dense oxide scale can be found. EDX maps (corresponding STEM and BF image in FIGS. 7d and e with the respective elemental maps for Cr, O, B, and Si, respectively) nicely depict, that the oxide scale consists of two layers with $Cr_2O_3$ crystals on the outside and silica on the coating to oxide scale interface—see bright orange area in the Si map. Due to the recrystallized remaining coating the surface is rather rough and the oxide scale thickness varies between 180 and 750 nm exhibiting an average thickness of 400±137 nm. The remaining coating thickness was close to the original thickness of about 2.6 µm but exhibiting a much higher standard deviation due to the roughness.

The results clearly prove the positive effects of silicon when alloyed (doped) to TM boride based coatings for enhancing the oxidation resistance, however this effect is attained only when the coating (in the context of the present invention: the protective layer) contains a certain amount of Si to enable the formation of a dense Si enriched scale according to the present invention as explained above.

The invention claimed is:

1. A coated article comprising a coated surface, the coated surface consisting of a substrate and a coating system, the coating system comprising at least one protective layer consisting of one or more transition metal borides and one dopant element, wherein:
   the protective layer having chemical element composition defined by the formula $TM_xB_ySi_q$, where TM is one or more transition metal elements selected from the group formed by chromium, Cr, and hafnium, Hf, Si is silicon and is present in the protective layer as the dopant element, B is boron, x is the concentration in atomic percent of TM in the protective layer, y is the concentration in atomic percent of B in the protective layer, and q is the concentration in atomic percent of Si in the protective layer, where x+y+q=1, 0.15≤x≤0.33, 0.40≤y≤0.67, and 0.1≤q≤0.40, and
   the atomic concentration ratio of boron to the transition metals in the protective layer is higher or equal to 2, i.e. y/x≥2, and
   the protective layer exhibits an $AlB_2$ crystal structure.

2. The coated article according to claim 1, wherein q is higher than 0.1 and not greater than 0.40.

3. The coated article according to claim 2, wherein q is higher than 0.2 and not greater than 0.40.

4. The coated article according to claim 3, wherein q is higher than 0.3 and not greater than 0.40.

5. The coated article according to claim 1, wherein the protective layer is placed as outermost layer of the coating system.

6. The coated article according to claim 1, wherein the coating system comprises an oxide layer formed as outermost layer of the coating system, the oxide layer comprising silicon and oxygen, or consisting of silicon and oxygen.

7. The coated article according to claim 6, wherein the protective layer is placed directly under the oxide layer.

8. The coated article according to claim 6, wherein the thickness of the oxide layer is in a range from 50 nm to 5000 nm.

9. The coated article according to claim 6, wherein the protective layer exhibits a separate crystalline Si phase, which is visible in the XRD spectrum of the protective layer at 2 theta angles of 28.44° or 47.3°.

10. The coated article according to claim 1, wherein the oxidation kinetic of the protective layer is in the range from $10^{-9}$ kg$^2$m$^{-4}$s$^{-1}$ up to $10_{-13}$ kg$^2$m$^{-4}$s$^{-1}$ for a temperature of 1100° C.

11. The coated article according to claim 1, wherein the substrate comprises or consists of one or more materials selected from the group formed by steel, cemented carbides, inconel, hastelloy, waspaloy, superalloys, Ti-containing materials, oxides, oxide-oxide ceramics, SiC-containing materials, carbon-based materials, yttria-stabilized zirconia.

12. A method for producing a coated article according to claim 1, wherein:
the at least one protective layer is formed by using a coating process.

13. A method for producing a coated article according to claim 6, wherein:
the at least one protective layer is formed by using a coating process, and
at least the oxide layer or a separate crystalline Si phase in the protective layer is/are produced by a heat treatment conducted after the coating process, wherein the AlB2 crystal structure is already produced during coating process, and maintained during and after the heat treatment, and wherein the heat treatment comprises an annealing process carried out at a process temperature in a range between 800° C. and 1500° C.

14. The method according to claim 12, wherein the coating process is carried out by using at least:
physical vapor deposition techniques, or
chemical vapor deposition techniques, or
thermal or plasma assisted chemical vapor deposition (TA-CVD or PA-CVD).

15. The method according to claim 14, wherein the coating process is carried out in such a manner that one or more targets comprising silicon are used as coating source material for providing the desired silicon concentration in an oxidation barrier coating layer during coating process, which is carried out by using physical vapor deposition techniques.

16. The method according to claim 14, wherein the coating process is carried out in such a manner that one or more gas flows comprising silicon are used as coating source material for providing the desired silicon concentration in an oxidation barrier coating layer during coating process, which is carried out by using physical vapor deposition techniques.

17. The coated article according to claim 6, wherein the oxide layer comprises silicon dioxide, $SiO_2$.

18. A method for producing a coated article according to claim 13, wherein the heat treatment comprises an annealing process carried out at a process temperature in a range between 1100° C. and 1300° C.

19. The method according to claim 15, wherein the physical vapor deposition techniques are of the type arc PVD techniques or sputtering PVD techniques.

20. The method according to claim 16, wherein the physical vapor deposition techniques are of the type arc PVD techniques or sputtering PVD techniques.

21. The method according to claim 19, wherein the physical vapor deposition techniques are magnetron sputtering or high power impulse magnetron sputtering (HiPIMS).

22. The method according to claim 20, wherein the physical vapor deposition techniques are magnetron sputtering or high power impulse magnetron sputtering (HiPIMS).

* * * * *